(12) United States Patent
Li et al.

(10) Patent No.: US 10,388,655 B2
(45) Date of Patent: Aug. 20, 2019

(54) INCREASING THICKNESS OF FUNCTIONAL LAYER ACCORDING TO INCREASING RECESS AREA

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Yong Li, Shanghai (CN); Jian Hua Xu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/473,318

(22) Filed: Mar. 29, 2017

(65) Prior Publication Data

US 2018/0033790 A1    Feb. 1, 2018

(30) Foreign Application Priority Data

Aug. 1, 2016  (CN) .......................... 2016 1 0620771

(51) Int. Cl.
*H01L 21/82*    (2006.01)
*H01L 27/092*   (2006.01)
(Continued)

(52) U.S. Cl.
CPC .... *H01L 27/0924* (2013.01); *H01L 21/28556* (2013.01); *H01L 21/82345* (2013.01);
(Continued)

(58) Field of Classification Search
CPC ..... H01L 21/823425; H01L 21/823821; H01L 27/0886; H01L 27/0924; H01L 27/10826;
(Continued)

(56) References Cited

U.S. PATENT DOCUMENTS

| 9,305,923 B1 | 4/2016 | Ok et al. |
| 2010/0081262 A1 | 4/2010 | Lim et al. |

(Continued)

FOREIGN PATENT DOCUMENTS

| CN | 104716171 | 6/2015 |
| WO | 2015047313 | 4/2015 |

OTHER PUBLICATIONS

European Application No. 17183769.3, Extended European Search Report dated Dec. 19, 2017, 9 pages.

*Primary Examiner* — Moin M Rahman
(74) *Attorney, Agent, or Firm* — Kilpatrick Townsend & Stockton LLP

(57) ABSTRACT

A method of manufacturing a semiconductor device includes providing a substrate having first and second semiconductor fins, forming an insulating layer on the substrate having first and second recesses exposing a portion of the respective first and second semiconductor fins, forming a gate dielectric layer on the first and second recesses and the exposed portions of the first and second semiconductor fins, forming a first work function adjustment layer on the gate dielectric layer, forming a functional layer on the first function adjustment layer, and forming first and second gates on portions of the functional layer of the respective first and second semiconductor fins. The opening area of the first recess is larger (Continued)

than the opening area of the second recess. The thickness of the functional layer on the first semiconductor fin is greater than the thickness of the functional layer on the second semiconductor fin.

16 Claims, 10 Drawing Sheets

(51) Int. Cl.
  *H01L 21/285*  (2006.01)
  *H01L 21/8234*  (2006.01)
  *H01L 29/40*  (2006.01)
  *H01L 29/49*  (2006.01)
  *H01L 29/66*  (2006.01)
  *H01L 29/78*  (2006.01)
  *H01L 21/8238*  (2006.01)
  *H01L 27/088*  (2006.01)

(52) U.S. Cl.
  CPC .......... *H01L 21/82385* (2013.01); *H01L 21/823431* (2013.01); *H01L 21/823456* (2013.01); *H01L 21/823821* (2013.01); *H01L 27/0886* (2013.01); *H01L 29/401* (2013.01); *H01L 29/4966* (2013.01); *H01L 29/66795* (2013.01); *H01L 29/7851* (2013.01)

(58) Field of Classification Search
  CPC .......... H01L 27/10879; H01L 27/1211; H01L 29/41791; H01L 29/66772; H01L 29/66795; H01L 29/7831; H01L 29/785; H01L 29/786; H01L 2029/785; H01L 2029/7858; H01L 2029/786; H01L 2924/13067; H01L 29/04–045; H01L 29/16–1608; H01L 29/18–185; H01L 29/22–2206; H01L 21/823431; H01L 21/845
  USPC ....... 257/401, 283, 347, 301, 349, 410, 384, 257/368, 288, 369, 57, 76, 327; 438/283, 438/151, 478, 481, 455, 197, 149, 187, 438/270, 268, 156, 599
  See application file for complete search history.

(56) References Cited

U.S. PATENT DOCUMENTS

| | | | |
|---|---|---|---|
| 2013/0187236 A1* | 7/2013 | Xie | H01L 29/4966 257/369 |
| 2013/0313648 A1 | 11/2013 | Chiang et al. | |
| 2014/0374840 A1 | 12/2014 | Lee et al. | |
| 2015/0041906 A1* | 2/2015 | Kamineni | H01L 21/823821 257/369 |
| 2015/0243658 A1 | 8/2015 | Joshi et al. | |
| 2015/0380305 A1* | 12/2015 | Basker | H01L 21/76846 257/77 |
| 2016/0093536 A1* | 3/2016 | Yang | H01L 21/82345 257/392 |
| 2016/0315175 A1* | 10/2016 | He | H01L 29/66795 |
| 2016/0351568 A1* | 12/2016 | Chang | H01L 29/785 |
| 2016/0365347 A1* | 12/2016 | Bao | H01L 27/0924 |
| 2017/0194210 A1* | 7/2017 | Oh | H01L 21/823456 |

* cited by examiner

INCREASING THICKNESS OF FUNCTIONAL LAYER ACCORDING TO INCREASING RECESS AREA

CROSS-REFERENCES TO RELATED APPLICATIONS

This application claims priority to Chinese Application No. 201610620771.X, filed on Aug. 1, 2016 with the State Intellectual Property Office of People's Republic of China, the content of which is incorporated herein by reference in its entirety.

FIELD OF THE INVENTION

The present invention relates to semiconductor technology. More particularly, embodiments of the present invention provide a semiconductor device and method of manufacturing the same.

BACKGROUND OF THE INVENTION

The work function of an n-type Fin Field Effect Transistor (FinFET) having a tungsten gate is mainly determined by the n-type work function adjustment layer. However, a functional layer is generally disposed between the n-type work function adjustment layer and the gate, and the functional layer typically uses a p-type work function adjustment layer such as TiN. Thus, the presence of the functional layer may adversely affect the work function of the n-type Fin Field Effect Transistor. In this case, it is desirable that the thickness of the functional layer is as small as possible.

Further, a residue (e.g., F) left in the gate after forming the gate may diffuse into the functional layer and into the n-type work function adjustment layer, which may also adversely affect the work function of the n-type Fin Field Effect Transistor. In this case, it is desirable that the thickness of the functional layer is as large as possible.

Therefore, the thickness of the functional layer is of particular importance for an n-type Fin Field Effect Transistor.

BRIEF SUMMARY OF THE INVENTION

Embodiments of the present invention include methods and resulting structure of implementing a semiconductor device that creates a greater thickness of the functional layer in a recess region having a larger opening surface than the functional layer in a recess region having a smaller opening surface.

Some embodiments of the present invention provide a method of manufacturing a semiconductor device. The method includes providing a semiconductor substrate comprising at least two semiconductor fins having first and second semiconductor fins; forming an insulating layer on the semiconductor substrate, the insulating layer comprising at least two recesses having a first recess exposing an upper portion of the first semiconductor fin and a second recess exposing an upper portion of the second semiconductor fin; forming a gate dielectric layer on the first and second recesses and the exposed upper portions of the first and second semiconductor fins; forming a first work function adjustment layer on the gate dielectric layer; forming a functional layer on the first function adjustment layer; and forming first and second gates on portions of the functional layer of the respective first and second semiconductor fins. The surface area of a lateral opening of the first recess is larger than the surface area of a lateral opening of the second recess, and a thickness of a portion of the functional layer on the first semiconductor fin is greater than a thickness of a portion of the functional layer on the second semiconductor fin.

In one embodiment, the first gate of the first semiconductor fin has a length in a longitudinal direction larger than a length of the second gate of the second semiconductor fin in the longitudinal direction.

In one embodiment, the length of the first gate is in a range between 45 nm and 55 nm, and the thickness of the portion of the functional layer on the first semiconductor fin is in a range between 20 nm and 40 nm; and the length of the second gate is in a range between 14 nm and 20 nm, and the thickness of the portion of the functional layer on the second semiconductor fin is in a range between 10 nm and 20 nm.

In one embodiment, the functional layer is configured to adjust the work function of the first and second gates and configured to be a diffusion barrier layer.

In one embodiment, forming the functional layer comprises a plasma enhanced chemical vapor deposition (PECVD) or an atomic layer deposition (ALD) process.

In one embodiment, the functional layer includes TiN; and the PECVD process includes the steps of:
(a) introducing a precursor of $TiCl_4$ and $NH_3$ into a reaction chamber to form a TiN layer;
(b) stopping introducing the precursor of $TiCl_4$ and $NH_3$ into the reaction chamber; introducing a purge gas into the reaction chamber for cleaning;
repeating (a) and (b) until a desired thickness of the functional layer is formed.

In one embodiment, the step (a) is performed at a temperature in a range between 400° C. and 500° C.

In one embodiment, the step of repeating (a) and (b) includes at least one iteration, and the method further includes, after performing step (b): step (c): introducing a source gas comprising a plasma $NH_3$ into the reaction chamber.

In one embodiment, the purge gas comprises an inert gas.

In one embodiment, the at least two semiconductor fins further includes a third semiconductor fin, and the at least two recesses further includes a third recess exposing an upper portion of the third semiconductor fin; the method further includes, after forming the first work function adjustment layer on the gate dielectric layer: removing a portion of the first work function adjustment layer on the gate dielectric layer on the first recess, on the first semiconductor fin, on the second recess and on the second semiconductor fin to expose a portion of the gate dielectric layer on the first recess, on the first semiconductor fin, on the second recess and on the second semiconductor fin; forming a next first work function adjustment layer on the exposed portion of the gate dielectric layer on the first recess, on the first semiconductor fin, on the second recess and on the second semiconductor fin and on a portion of the first work function adjustment layer on the third recess and on the third semiconductor fin; and forming a second work function adjustment layer on the next first work function adjustment layer. Forming the functional layer on the first work function layer includes: forming the functional layer on the second work function adjustment layer.

In one embodiment, the first work function adjustment layer is an n-type work function adjustment layer. In one embodiment, the n-type work function adjustment layer comprises TiAl, TiCAl, TiNAl, or TiSiAl.

In one embodiment, the first work function adjustment layer is a p-type work function adjustment layer, and the second work function adjustment layer is an n-type work function adjustment layer. In one embodiment, the p-type work function adjustment layer includes TiN, TaN, or TaC; and the n-type work function adjustment layer includes TiAl, TiCAl, TiNAl, or TiSiAl.

In one embodiment, the method further includes forming a third gate on the functional layer of the third semiconductor fin.

In one embodiment, forming the first, second and third gates comprises: forming a gate layer on the functional layer; and planarizing the gate layer to form the first, second, and third gates.

Embodiments of the present invention also provide a semiconductor device. The semiconductor device includes a semiconductor substrate comprising at least two semiconductor fins having first and second semiconductor fins; an insulating layer on the semiconductor substrate, the insulating layer comprising at least two recesses having a first recess exposing an upper portion of the first semiconductor fin and a second recess exposing an upper portion of the second semiconductor fin; a gate dielectric layer on the first and second recesses and the exposed upper portions of the first and second semiconductor fins; a first work function adjustment layer on the gate dielectric layer; a functional layer on the first function adjustment layer; and first and second gates on portions of the functional layer of the respective first and second semiconductor fins. The surface area of a lateral opening of the first recess is larger than the surface area of a lateral opening of the second recess. The thickness of a portion of the functional layer on the first semiconductor fin is greater than the thickness of a portion of the functional layer on the second semiconductor fin.

In one embodiment, the first gate of the first semiconductor fin has a length in a longitudinal direction larger than a length of the second gate of the second semiconductor fin in the longitudinal direction.

In one embodiment, the at least two semiconductor fins further includes a third semiconductor fin; the at least two recesses further includes a third recess exposing an upper portion of the third semiconductor fin; and a second work function adjustment layer on the first work function adjustment layer. The first work function adjustment layer is a p-type work function adjustment layer, and the second work function adjustment layer is an n-type work function adjustment layer.

In one embodiment, the p-type work function adjustment layer comprises TiN, TaN, or TaC; and the n-type work function adjustment layer comprises TiAl, TiCAl, TiNAl, or TiSiAl The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
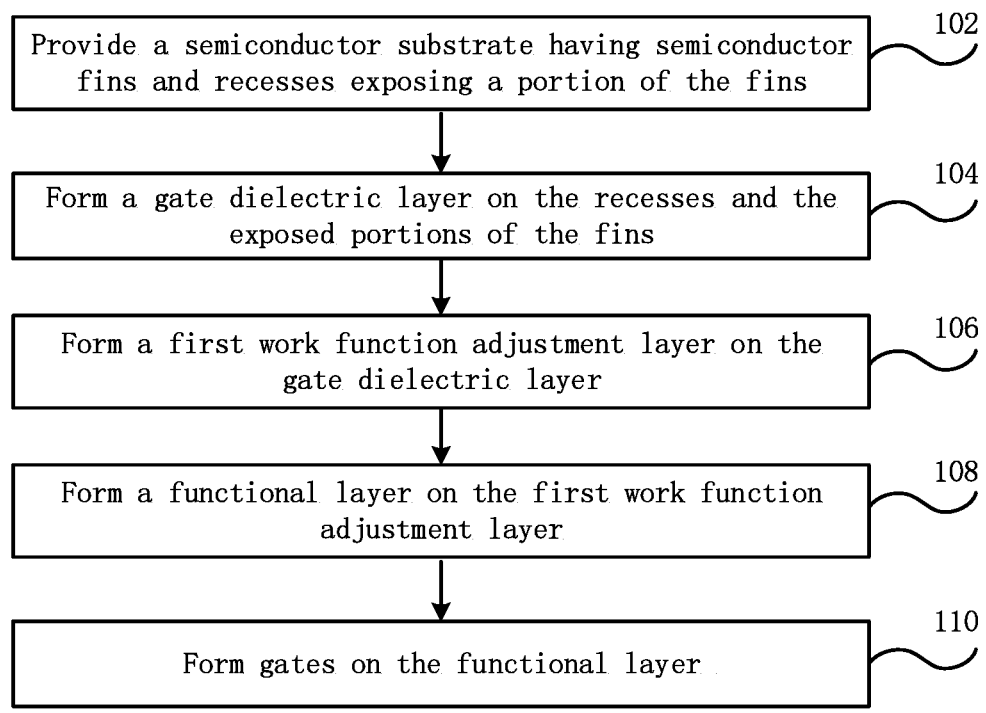
FIG. 1 is a flowchart illustrating a method for manufacturing of a semiconductor device according to one embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures' of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third." etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The use of the terms first, second, third, etc. do not denote any order, but rather the terms first, second, third, etc. are used to distinguish one element from another. Furthermore, the use of the terms a, an, etc. does not denote a limitation of quantity, but rather denote the presence of at least one of the referenced items.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

As described in the background section, when the silicide layers of adjacent source regions are joined together, the surface area of the joined silicide layers is relatively small and the contact resistance is high, or when the silicide layers of adjacent source regions are not joined together, the volume of the epitaxial silicide layers is relatively small, the surface of the contact element has a polygonal shape, the surface area of the contact element is small, and the contact element has a high resistance. Thus, the present inventor provide a method for manufacturing a semiconductor device that can provide a large volume and a large surface area of the source or drain region to reduce the contact resistance.

In accordance with some embodiments of the present invention, FIG. 1 is a flowchart diagram illustrating a manufacturing method according to one embodiment of the present invention. FIGS. 2A through 2F are cross-sectional views of intermediate stages of a manufacturing method according to some embodiments of the present invention. In the disclosure, each drawing or block in the flowchart diagram represents a process associated with embodiments of the method described. Those of skill in the art will recognize that additional blocks and drawings that describe the embodiments may be added.

Figure 2A:
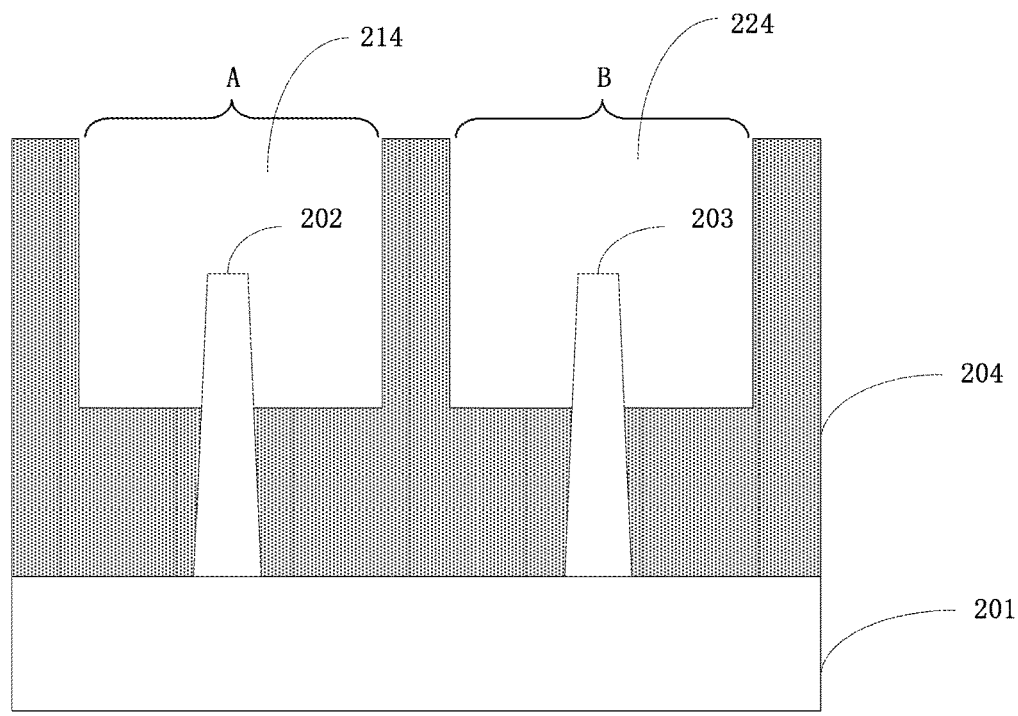
FIG. 2A is a cross-sectional view of an intermediate stage of a manufacturing method according to some embodiments of the present invention.

Referring to FIG. 1, in step 102, a semiconductor structure is provided. As shown in FIG. 2A, the semiconductor structure may include a semiconductor substrate 201, and at least two semiconductor fins on semiconductor substrate 201. In one embodiment, semiconductor substrate 201 may be a silicon substrate, and a well region (not shown) may be formed in semiconductor substrate 201. The at least two semiconductor fins may include a first semiconductor fin 202 and a second semiconductor fin 203. The substrate structure may also include an insulating material layer 204 on semiconductor substrate 201. Insulating material layer 204 may include a shallow trench isolation (STI) region and an interlayer dielectric layer. Referring to FIG. 2A, insulating material layer 204 has at least two recesses including a first recess 214 and a second recess 224. First recess 214 exposes an upper portion of first semiconductor fin 202, and second recess 224 exposes an upper portion of second semiconductor fin 203. The opening A of first recess 214 has a lateral surface area greater than a lateral surface area of the opening B of second recess 224. As used herein, the term "the lateral surface area of an opening A) is defined as a surface area of the opening of an recess in a direction parallel to the surface of the substrate. Further, in one embodiment, an interface layer (not shown) is formed on the exposed portion of the first semiconductor fin 202 and second semiconductor fin 203. The interface layer may include a silicon oxide layer.

Figure 2B:
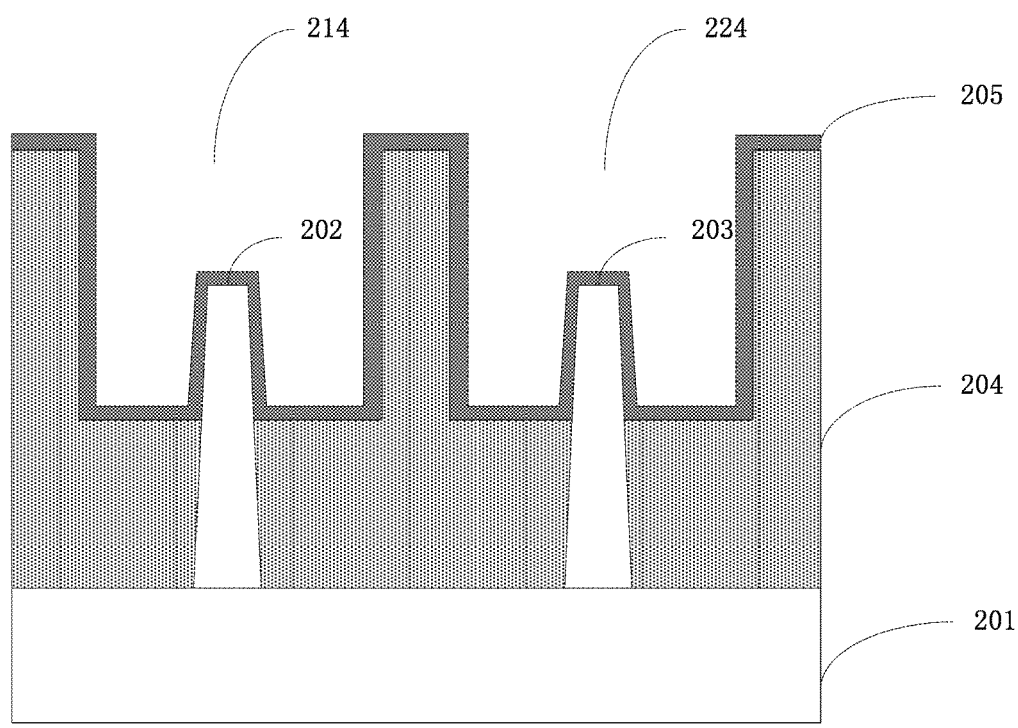
FIG. 2B is a cross-sectional view of an intermediate stage of a manufacturing method according to some embodiments of the present invention.

Next, in step 104, a gate dielectric layer is formed on each of the recesses and the exposed portions of the semiconductor fins. As shown in FIG. 2B, a gate dielectric layer 205 is formed on the surface of first recess 214 and the corresponding exposed portion of first semiconductor fin 202 and on second recess 224 and on the corresponding exposed portion of second semiconductor fin 203. Further, an annealing process may be performed after forming the gate dielectric layer.

Figure 2C:
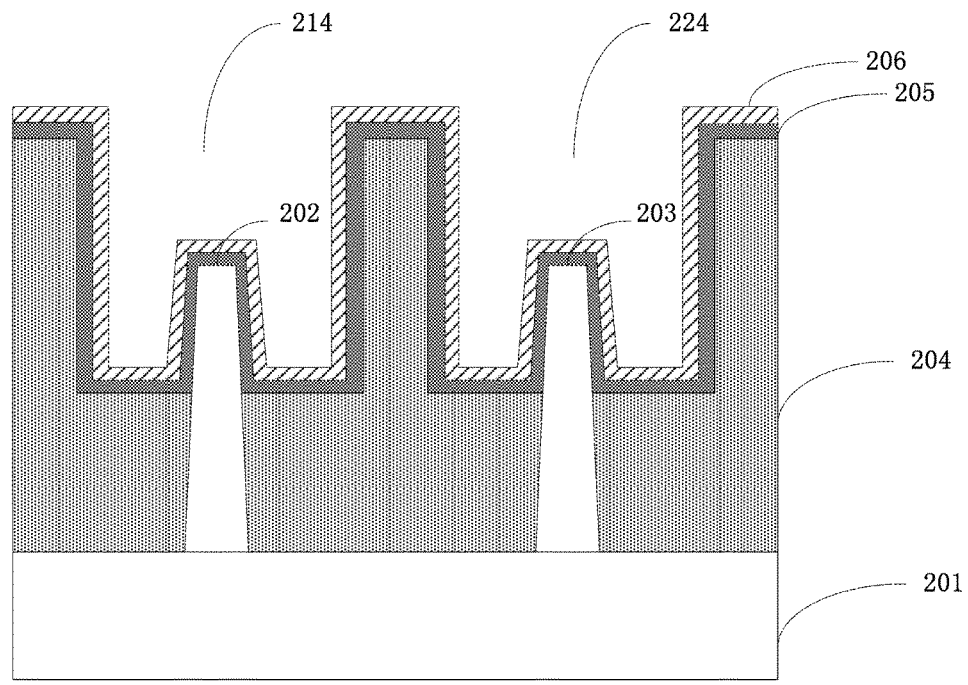
FIG. 2C is a cross-sectional view of an intermediate stage of a manufacturing method according to some embodiments of the present invention.

Next, in step 106, a first work function adjustment layer 206 is formed on gate dielectric layer 205, as shown in FIG. 2C. In one embodiment, first work function adjustment layer 206 may be an n-type work function adjustment layer including, e.g., TiAl, TiCAl, TiNAl, or TiSiAl.

Figure 2D:
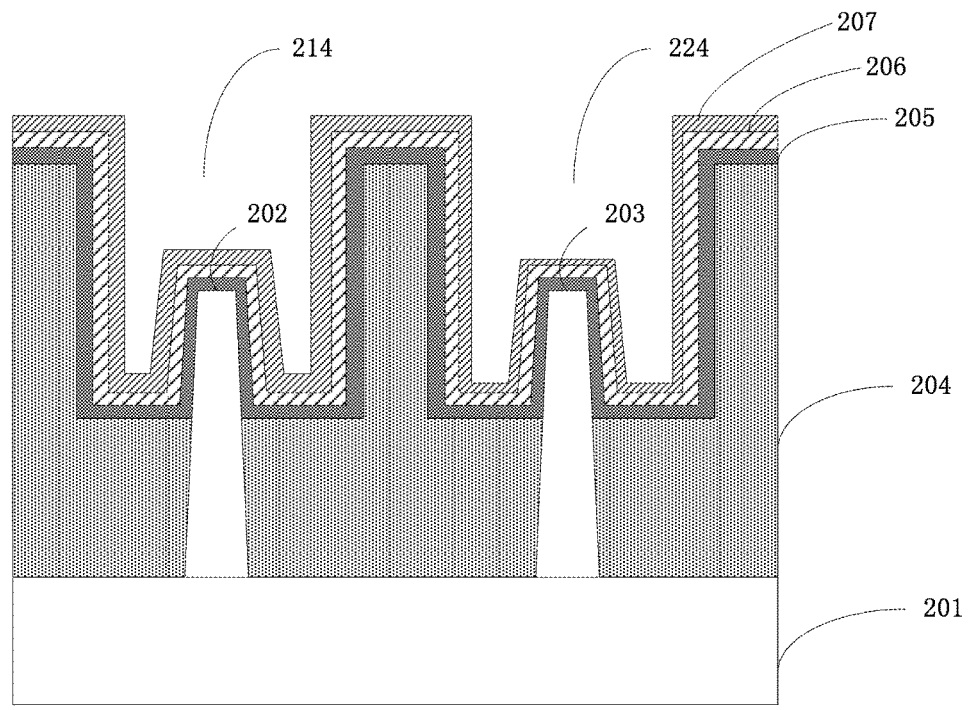
FIG. 2D is a cross-sectional view of an intermediate stage of a manufacturing method according to some embodiments of the present invention.

Next, in step 108, a functional layer 207 is formed on first work function adjustment layer 206, as shown in FIG. 2D. In one embodiment, functional layer 207 may be used to adjust the work function of a subsequent formed gate and to serve as a diffusion barrier layer. In an example embodiment, functional layer 207 includes TiN. A portion of function layer 207 on first semiconductor fin 202 has a thickness greater than a thickness of a portion of function layer 207 on second semiconductor fin 203. In one embodiment, forming functional layer 207 on first work function adjustment layer 206 of first recess 214 and of second recess 214 may be performed in one step. In another embodiment, forming functional layer 207 on first work function adjustment layer 206 of first recess 214 and of second recess 214 may be performed in multiple steps, for example, a first portion of functional layer 207 may be first formed on first work function adjustment layer 206 of first recess 214, and a second portion of functional layer 207 may be then formed on first work function adjustment layer 206 of second recess 224, and vice versa.

Figure 2E:
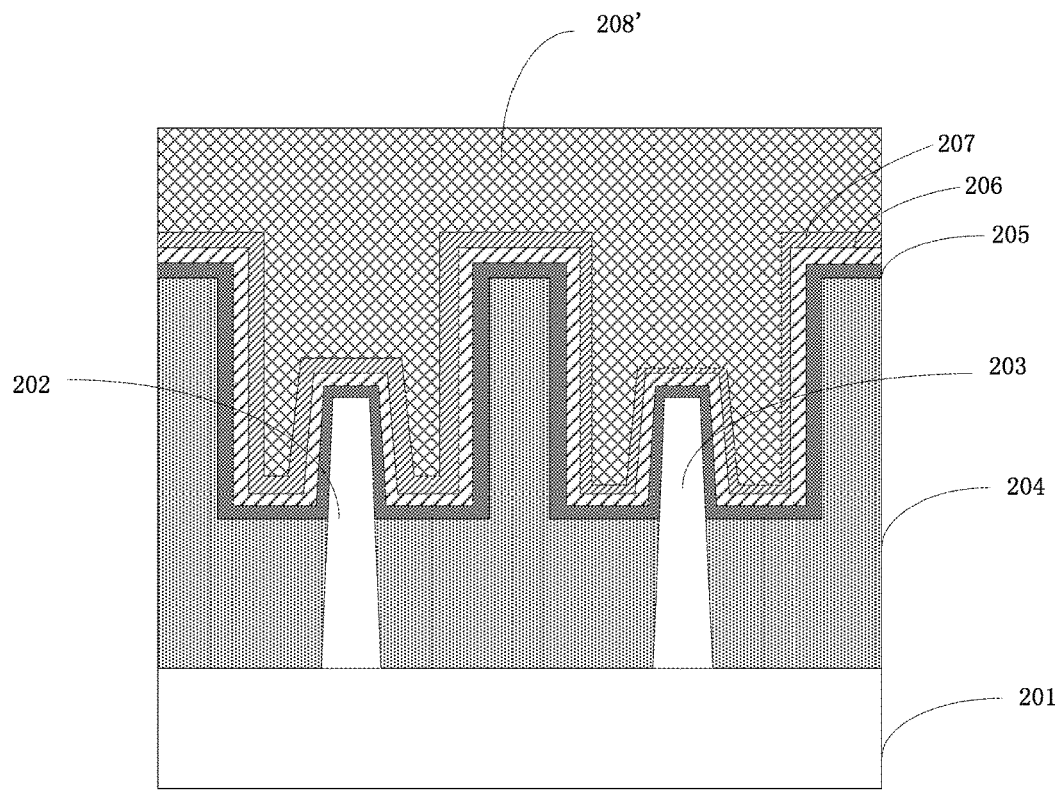
FIG. 2E is a cross-sectional view of an intermediate stage of a manufacturing method according to some embodiments of the present invention.

Next, in step 110, a gate layer 208' is formed on functional layer 207, as shown in FIG. 2E. In an example embodiment, tungsten (W) may be deposited on functional layer 207 as gate layer 208'.

Figure 2F:
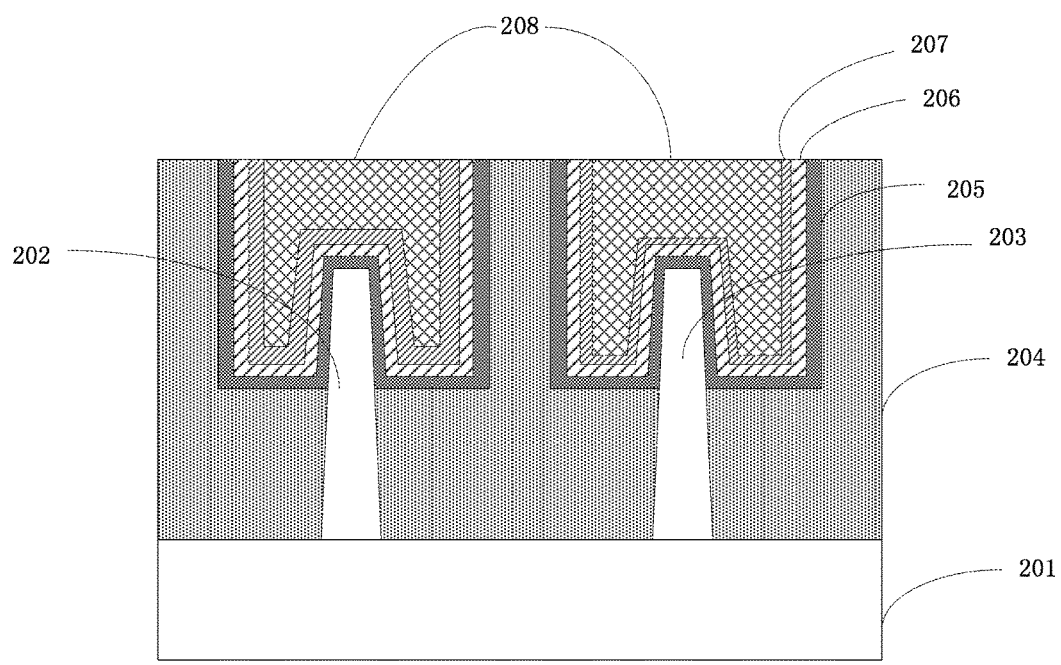
FIG. 2F is a cross-sectional view of an intermediate stage of a manufacturing method according to some embodiments of the present invention.

Further, after forming gate layer 208', a planarization (e.g., chemical mechanical polishing) process may be formed on gate layer 208' to form gates 208 on the first and second fins, as shown in FIG. 2F.

In the method for manufacturing a semiconductor device according to one embodiment of the present invention, different portions of the functional layer have different thicknesses that depend from the lateral surface areas of the openings of the different recesses. The thickness of a first portion of the functional layer may be relatively large because of the large amount of residues left in the recess (e.g., first recess) having a relatively larger lateral surface area of the opening when the gate is formed, and thus the thickness of the first portion of the functional layer is relatively large, thereby reducing the diffusion effect of the residue on the device work function. The thickness of a second portion of the functional layer may be relatively small because of the small amount of residues left in the recess (e.g., second recess) having a smaller lateral surface area of the opening when the gate is formed, and thus the thickness of the second portion of the functional layer is relatively small, thereby reducing the effect of the functional layer itself on the device work function.

The present inventor discovered that the channel length is related to the thickness of the functional layer and concluded that different thicknesses of a functional layer may be formed in a device having different channel lengths to minimize the effect of the functional layer on the work function of the device.

In one embodiment, the length of a gate on the first semiconductor fin of the first recess in the longitudinal direction (i.e., the first channel, also referred to as the long channel) is longer than the length of a gate on the second semiconductor fin of the second recess in the longitudinal direction (i.e., the second channel, also referred to as the short channel). That is, the thickness of the portion of the functional layer in the device having the long channel may be larger than the thickness of the portion of the functional layer in the device having the short channel. In a preferred embodiment, the length of the gate on the first semiconductor fin of the first recess in the longitudinal direction is in the range between 45 nm and 55 nm, e.g., 50 nm. The functional layer on the first semiconductor fin may have a thickness in the range between 20 nm and 40 nm. The length of the gate on the second semiconductor fin of the second recess in the longitudinal direction is in the range between 14 nm and 20 nm, e.g., 16 nm. The functional layer on the second semiconductor fin may have a thickness in the range between 10 nm and 20 nm. As described above, the present inventor discovered that the gate length and the functional layer thickness dependent from each other. In some embodiments, the ratio of gate length to the functional layer thickness is in the range between 0.7 and 2.75. By maintaining a ratio range between the channel length and the functional layer thickness, the effect of the functional layer on the work function of the semiconductor device can be reduced.

In one embodiment, forming a functional layer having different thicknesses in different recesses may be realized using a plasma enhanced chemical vapor deposition (PECVD) or atomic layer deposition (ALD) process.

The following disclosure uses a TiN functional layer as an example to describe the formation of a functional layer using a PECVD process.

First, in step (a), a precursor $TiCl_4$ and $NH_3$ is supplied to a reaction chamber, TiN is formed by the reaction of $TiCl_4$ and $NH_3$. For example, TiN may be formed by thermal deposition at a temperature in the range between 400° C. and 500° C.

Next, in step (b), the supply of $TiCl_4$ and $NH_3$ is stopped. A purge gas is supplied into the reaction chamber for cleaning. The purge gas may include an inert gas such as argon. Alternatively, the purge gas may include hydrogen. After cleaning, any residue in step (a) may be removed to avoid the effect of residue on subsequent deposition.

Thereafter, steps (a) and (b) are repeatedly performed until a desired thickness of the functional layer is formed. The step coverage of PECVD is close to 80%, the effect of TiN loading by PECVD can be achieved by depositing a thicker TiN layer in a larger lateral surface area of a recess.

Preferably, at least one iteration of steps (a) and (b) will be repeated. After performing step (b), the method may further include step (c) that includes introducing a source gas including a plasma of $NH_3$ in the reaction chamber. For example, steps (a) and (b) may be performed repeatedly 10 times, and step (c) may be performed once after step (b). The present inventor discovered that, in the process of forming TiN using the PECVD technique, the introduction of the plasma of NH3 as the source gas can increase the N content in the subsequent step (a) and decrease the Cl content. That enables the increase of the thickness of the functional layer deposited in the first recess having a large lateral opening area more than the thickness of the thickness of the functional layer deposited in the second recess having a smaller lateral opening area, i.e., the loading effect of PECVD is increased, to improve the deposition of a thicker TiN layer in a recess with a larger lateral surface area of the opening.

Figure 3:
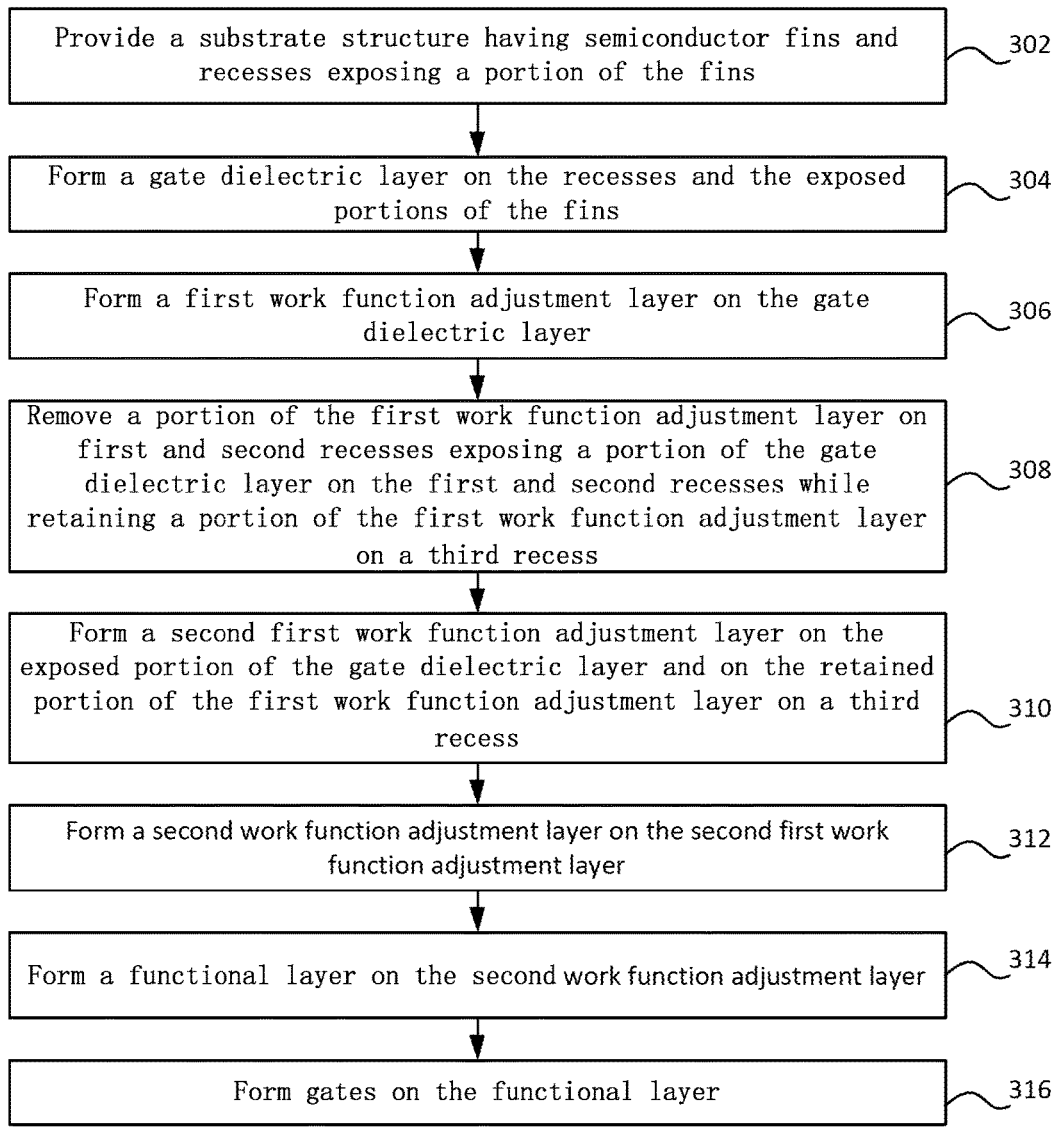
FIG. 3 is a flowchart illustrating a method for manufacturing of a semiconductor device according to another embodiment of the present invention.

FIG. 3 is a simplified flowchart of a method of manufacturing a semiconductor device according to another embodiment of the present invention. FIGS. 4A through 4I are cross-sectional views of various stages of a method of manufacturing a semiconductor device according to another embodiment of the present invention. The method of manufacturing a semiconductor device according to another embodiment of the present invention will be described with reference to FIG. 3 and FIGS. 4A through 4I.

Figure 4A:
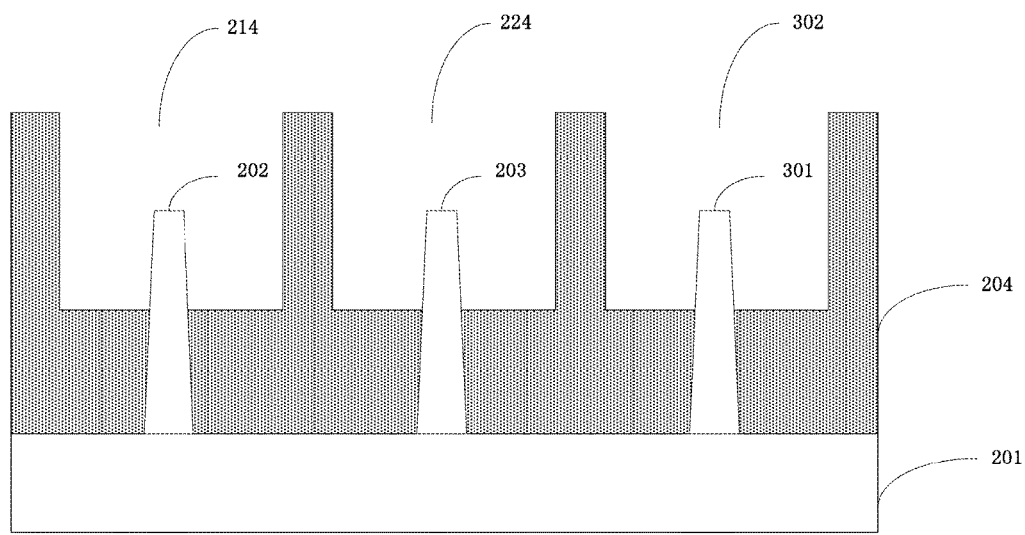
FIG. 4A is a cross-sectional view of an intermediate stage of a manufacturing method according to some embodiments of the present invention.

Referring to FIG. 3, in step 302, a substrate structure is provided. As shown in FIG. 4A, comparing with the structure of FIG. 2A, the substrate structure of FIG. 3A further includes, in addition to first and second semiconductor fins 202, 203, a third semiconductor fin 301, and in addition to first and second recesses 214, 224, a third recess 302 exposing an upper portion of third semiconductor fin 301.

Figure 4B:
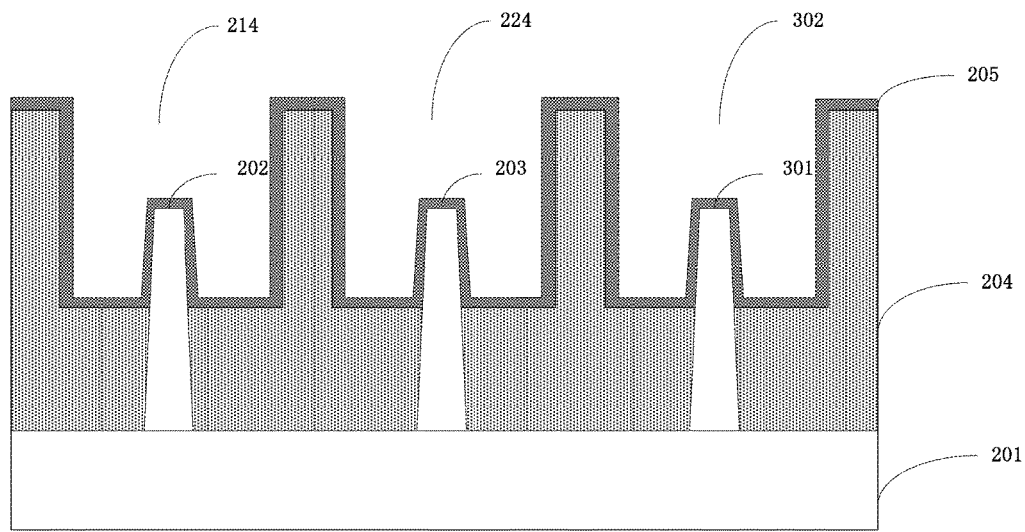
FIG. 4B is a cross-sectional view of an intermediate stage of a manufacturing method according to some embodiments of the present invention.

Next, in step 304, a gate dielectric layer is formed on each of the recesses and the exposed surfaces of the corresponding semiconductor fins. As shown in FIG. 4B, a gate dielectric layer 205 (e.g., a high-k dielectric layer) is formed on the surface of first recess 214 and corresponding first semiconductor fin 202, on the surface of second recess 224 and corresponding second semiconductor fin 203, and on the surface of third recess 302 and corresponding third semiconductor fin 301.

Figure 4C:
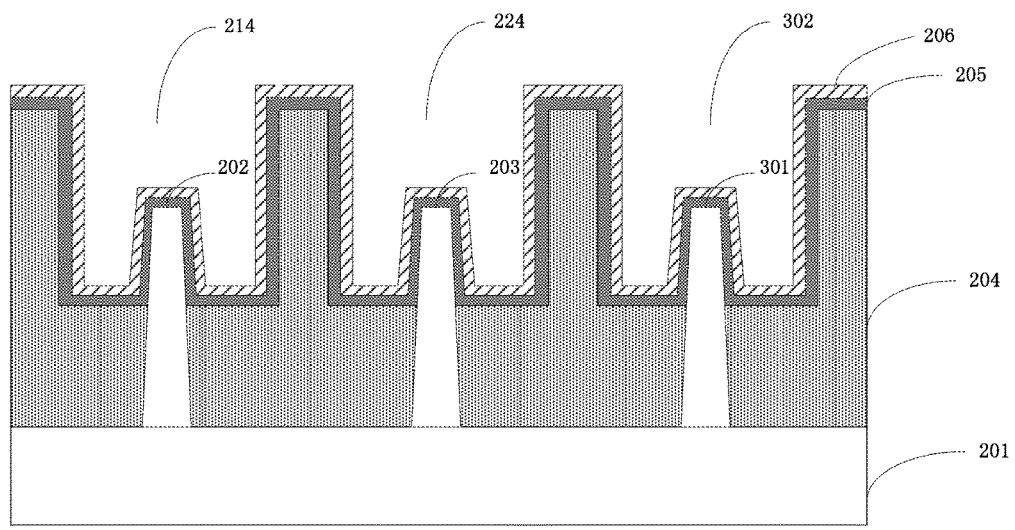
FIG. 4C is a cross-sectional view of an intermediate stage of a manufacturing method according to some embodiments of the present invention.

Thereafter, in step 306, a first work function adjustment layer 206 is formed on gate dielectric layer 205, as shown in FIG. 4C. In one embodiment, first work function adjustment layer 206 is a p-type work function adjustment layer. In an exemplary embodiment, the p-type work function adjustment layer may include TiN, TaN, or TaC.

Figure 4D:
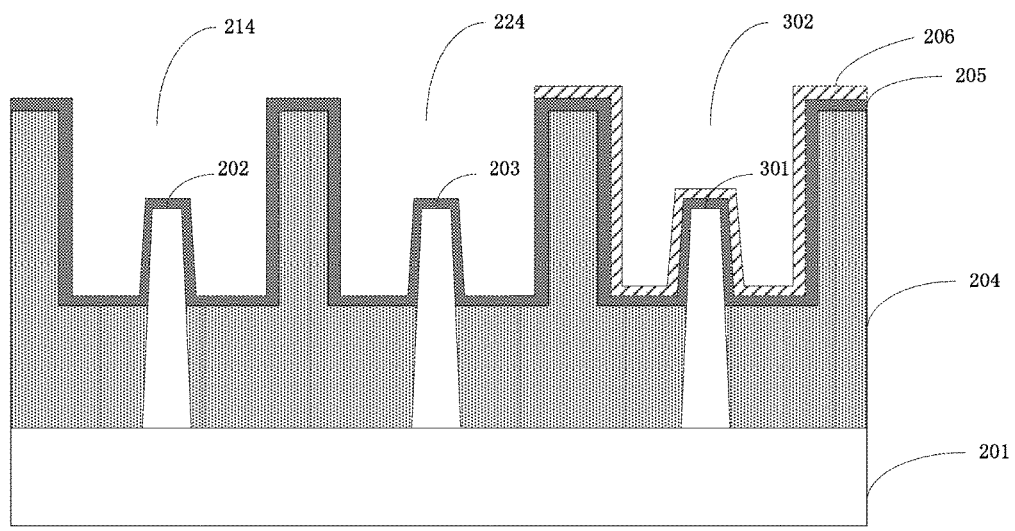
FIG. 4D is a cross-sectional view of an intermediate stage of a manufacturing method according to some embodiments of the present invention.

Next, in step 308, a portion of first work function adjustment layer 206 on gate dielectric layer 205 on the surface of first semiconductor fin 202 of first recess 214 and on gate dielectric layer 205 on the surface of second semiconductor fin 203 of second recess 224 is removed, as shown in FIG. 4D. For example, a mask layer my be formed on a portion of first work function adjustment layer 206 on gate dielectric layer 205 on the surface of third semiconductor fin 301 of third recess 302, then the portion of first work function adjustment layer 206 not covered by the mask layer is removed.

Figure 4E:
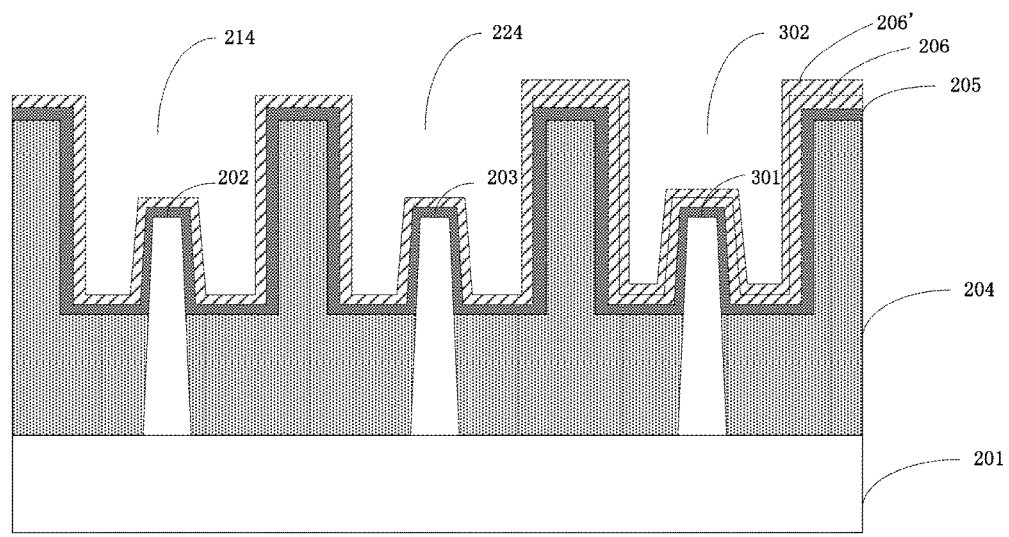
FIG. 4E is a cross-sectional view of an intermediate stage of a manufacturing method according to some embodiments of the present invention.

Next, in step 310, a second first work function adjustment layer 206' is formed on a portion of gate dielectric layer 205 on the surface of first semiconductor fin 202 of first recess 214 and a portion of gate dielectric layer 205 on the surface of second semiconductor fin 203 of second recess 224, and on a portion of first work function adjustment layer 206 on the surface of third semiconductor fin 301 of third recess 302, as shown in FIG. 4E.

Figure 4F:
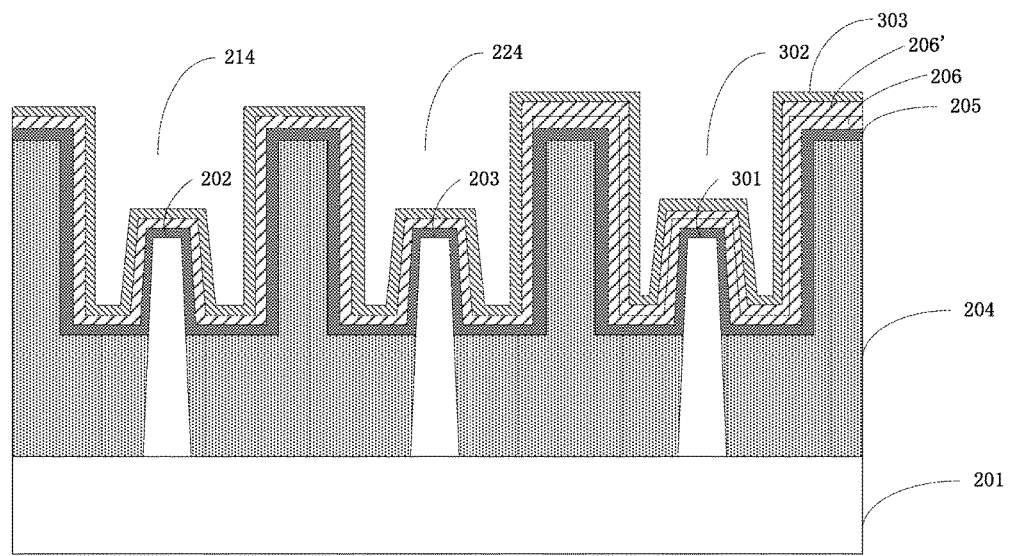
FIG. 4F is a cross-sectional view of an intermediate stage of a manufacturing method according to some embodiments of the present invention.

Next, in step 312, a second work function adjustment layer 303 is formed on second first work function adjustment layer 206', as shown in FIG. 4F. In one embodiment, second work function adjustment layer 303 is an n-type work function adjustment layer including, for example, TiAl, TiCAl, TiNAl, or TiSiAl.

Figure 4G:
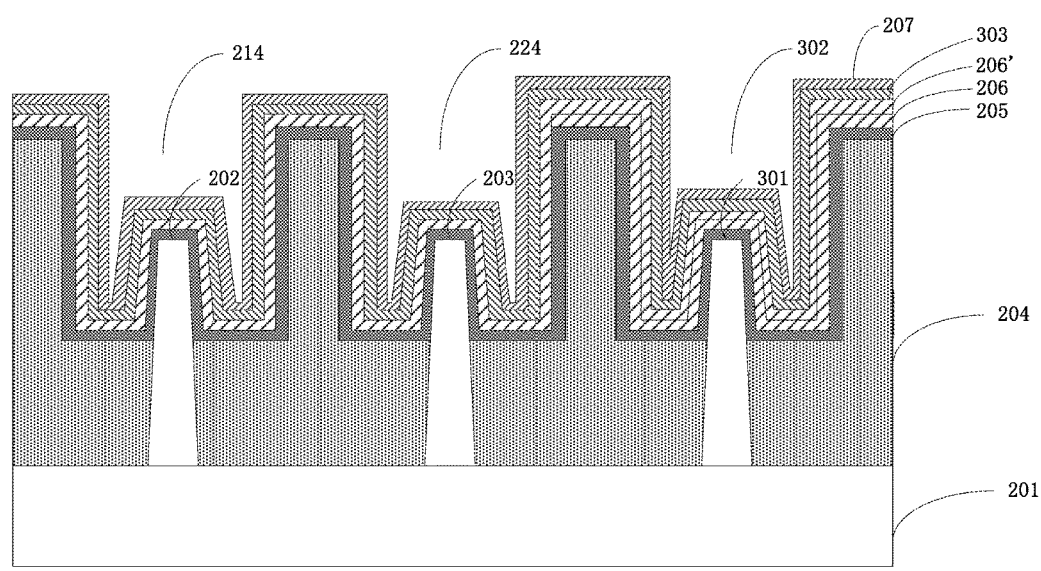
FIG. 4G is a cross-sectional view of an intermediate stage of a manufacturing method according to some embodiments of the present invention.

Next, in step 314, a functional layer 207 is formed on second work function adjustment layer 303, as shown in FIG. 4G. TiN layer may be formed as the functional layer according to the TiN forming process described in above sections.

Figure 4H:
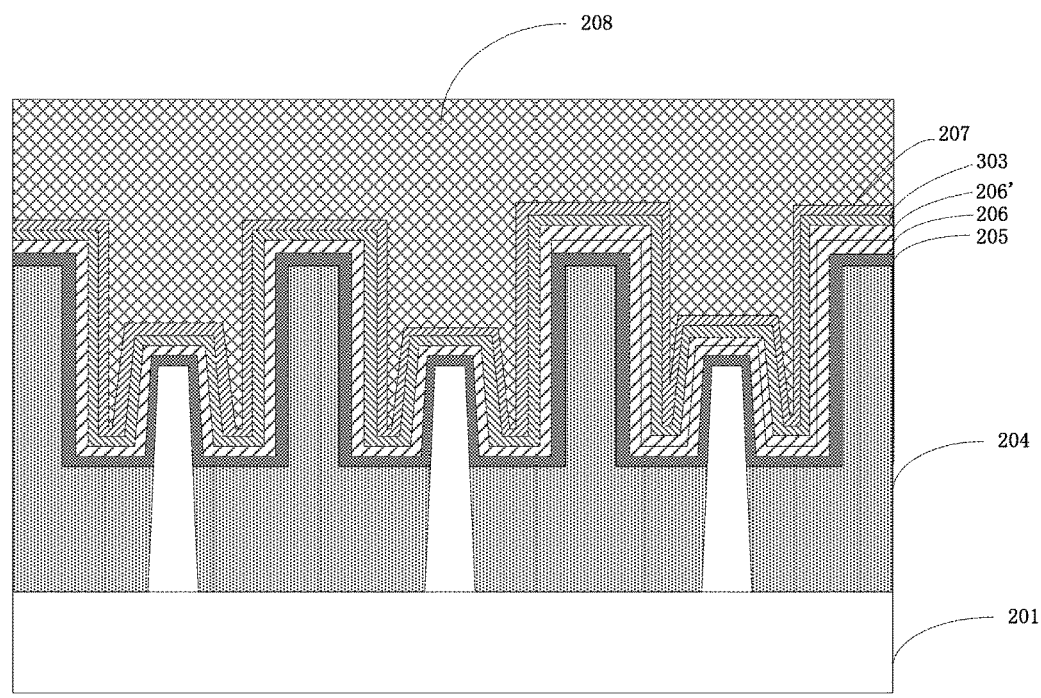
FIG. 4H is a cross-sectional view of an intermediate stage of a manufacturing method according to some embodiments of the present invention.

Thereafter, a gate layer (e.g., tungsten) 208' is formed on functional layer 207, as shown in FIG. 4H.

Figure 4I:
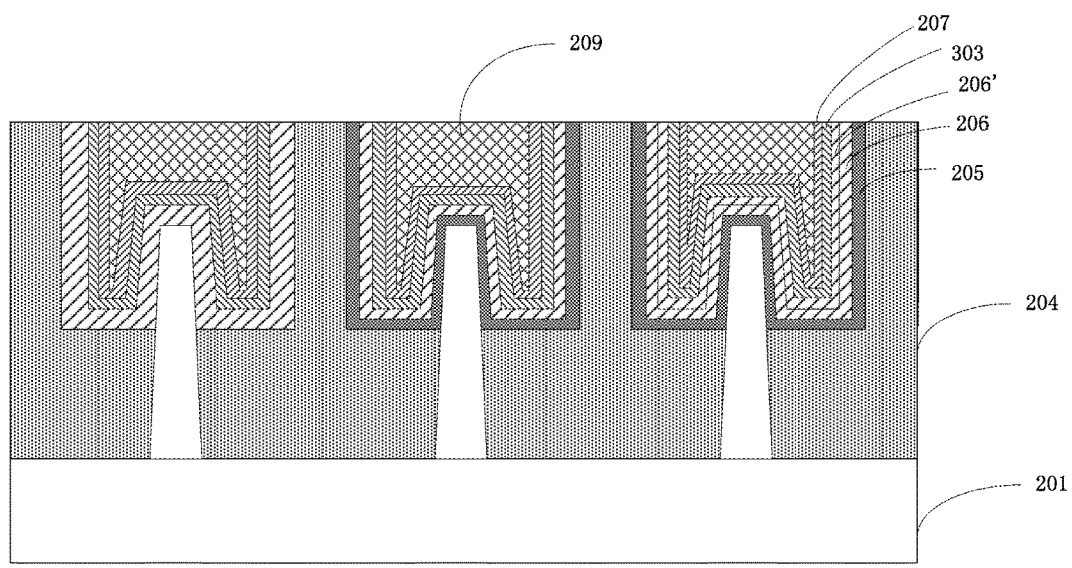
FIG. 4I is a cross-sectional view of an intermediate stage of a manufacturing method according to some embodiments of the present invention.

Thereafter, a planarization process is performed on gate layer 208 to form gates 208 of the semiconductor fins in the recesses, as shown in FIG. 4I.

Thus, embodiments of the present invention provide a semiconductor device and method for manufacturing the same that have different thicknesses of a functional layer in the semiconductor device having different channel lengths to minimize the effect of the functional layer on the work function of the semiconductor device.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of manufacturing a semiconductor device, the method comprising:
   providing a semiconductor substrate comprising at least two semiconductor fins having first and second semiconductor fins;
   forming an insulating layer on the semiconductor substrate, the insulating layer comprising at least two recesses having a first recess exposing an upper portion of the first semiconductor fin and a second recess exposing an upper portion of the second semiconductor fin, the at least two recesses being separated from each other by a portion of the insulating layer and having a bottom surface lower than an upper surface of the insulating layer;
   forming a gate dielectric layer on the first and second recesses and the exposed upper portions of the first and second semiconductor fins including sidewalls and a top surface thereof;
   forming a first work function adjustment layer on the gate dielectric layer on the first and second recesses;
   forming a functional layer on the first work function adjustment layer; and
   forming first and second gates on portions of the functional layer of the respective first and second semiconductor fins,
   wherein a surface area of a lateral opening of the first recess comprising the first work function adjustment layer is larger than a surface area of a lateral opening of the second recess comprising the first work function adjustment layer, and a thickness of a portion of the functional layer on the first semiconductor fin is greater than a thickness of a portion of the functional layer on the second semiconductor fin.

2. The method of claim 1, wherein the first gate of the first semiconductor fin has a length in a longitudinal direction larger than a length of the second gate of the second semiconductor fin in the longitudinal direction.

3. The method of claim 2, wherein the length of the first gate is in a range between 45 nm and 55 nm, and the thickness of the portion of the functional layer on the first semiconductor fin is in a range between 20 nm and 40 nm; and
   the length of the second gate is in a range between 14 nm and 20 nm, and the thickness of the portion of the functional layer on the second semiconductor fin is in a range between 10 nm and 20 nm.

4. The method of claim 1, wherein the functional layer is configured to adjust a work function of the first and second gates and configured to be a diffusion barrier layer.

5. The method of claim 1, wherein forming the functional layer comprises a plasma enhanced chemical vapor deposition (PECVD) or an atomic layer deposition (ALD) process.

6. The method of claim 5, wherein the functional layer comprises TiN; and the PECVD process comprises:
   (a) introducing a precursor of $TiCl_4$ and $NH_3$ into a reaction chamber to form a TiN layer;
   (b) stopping introducing the precursor of $TiCl_4$ and $NH_3$ into the reaction chamber; introducing a purge gas into the reaction chamber for cleaning;
   repeating (a) and (b) until a predetermined thickness of the functional layer is formed.

7. The method of claim 6, wherein (a) is performed at a temperature in a range between 400° C. and 500° C.

8. The method of claim 6, wherein repeating (a) and (b) comprises at least one iteration, and the method further comprises, after performing (b):
   (c) introducing a source gas comprising a plasma $NH_3$ into the reaction chamber.

9. The method of claim 6, wherein the purge gas comprises an inert gas.

10. The method of claim 1, wherein the at least two semiconductor fins further comprises a third semiconductor fin, and the at least two recesses further comprises a third recess exposing an upper portion of the third semiconductor fin; the method further comprising, after forming the first work function adjustment layer on the gate dielectric layer:
   removing a portion of the first work function adjustment layer on the gate dielectric layer on the first recess, on the first semiconductor fin, on the second recess and on the second semiconductor fin to expose a portion of the gate dielectric layer on the first recess, on the first semiconductor fin, on the second recess and on the second semiconductor fin;
   forming a next first work function adjustment layer on the exposed portion of the gate dielectric layer on the first recess, on the first semiconductor fin, on the second recess and on the second semiconductor fin and on a portion of the first work function adjustment layer on the third recess and on the third semiconductor fin;

forming a second work function adjustment layer on the next first work function adjustment layer;

wherein forming the functional layer on the first work function adjustment layer comprises:

forming the functional layer on the second work function adjustment layer.

11. The method of claim 1, wherein the first work function adjustment layer is an n-type work function adjustment layer.

12. The method of claim 11, wherein the n-type work function adjustment layer comprises TiAl, TiCAl, TiNAl, or TiSiAl.

13. The method of claim 10, wherein the first work function adjustment layer is a p-type work function adjustment layer, and the second work function adjustment layer is an n-type work function adjustment layer.

14. The method of claim 13, wherein the p-type work function adjustment layer comprises TiN, TaN, or TaC; and the n-type work function adjustment layer comprises TiAl, TiCAl, TiNAl, or TiSiAl.

15. The method of claim 10, further comprising forming a third gate on the functional layer of the third semiconductor fin.

16. The method of claim 15, wherein forming the first, second and third gates comprises:

forming a gate layer on the functional layer; and planarizing the gate layer to form the first, second, and third gates.

* * * * *